United States Patent [19]

Le et al.

[11] Patent Number: 4,755,451
[45] Date of Patent: Jul. 5, 1988

[54] DEVELOPER FOR COLOR PROOFING FILM WITH AN ALKYL GLYCOL DERIVATIVE OF CYCLOHEXANE

[75] Inventors: Kim-Chi T. Le; John G. Schommer, both of San Diego, Calif.

[73] Assignee: Sage Technology, Waltham, Mass.

[21] Appl. No.: 901,312

[22] Filed: Aug. 28, 1986

[51] Int. Cl.$^4$ .............................................. G03C 5/00
[52] U.S. Cl. .................................... 430/331; 430/309; 430/293
[58] Field of Search ................. 430/331, 309, 293, 197

[56] References Cited

U.S. PATENT DOCUMENTS

| | | | |
|---|---|---|---|
| 3,136,637 | 6/1964 | Larson | 96/75 |
| 3,671,236 | 6/1972 | Van Beusekom | 96/15 |
| 4,030,920 | 6/1977 | Kuh et al. | 430/227 |
| 4,271,261 | 6/1981 | Shimizu et al. | 430/309 |
| 4,328,304 | 5/1982 | Tachikawa et al. | 430/331 |
| 4,370,406 | 1/1983 | Jones | 430/331 |
| 4,416,976 | 11/1983 | Schell | 430/309 |
| 4,495,270 | 1/1985 | Tsubota et al. | 430/218 |
| 4,576,743 | 3/1986 | Kita et al. | 430/331 |

OTHER PUBLICATIONS

Two page reprint from *American Printer*, Jul., 1985, entitled "A Color Proofing Update".

*Primary Examiner*—Roland E. Martin
*Assistant Examiner*—Patrick A. Doody
*Attorney, Agent, or Firm*—Philip G. Kiely

[57] ABSTRACT

A developer for lithographic proof films is described. The developer composition contains a glycol acetate, a cyclic alkyl glycol, a surfactant and a cosolvent, all present in a water base. No nonaqueous component of the composition exceeds 30 weight percent of the composition. The compositions are nontoxic, nonflammable and have good odor characteristics while providing developer properties equal or superior to the high solvent content developers of the prior art. The developers may be used to develop both process color films and opaque films.

14 Claims, No Drawings

DEVELOPER FOR COLOR PROOFING FILM WITH AN ALKYL GLYCOL DERIVATIVE OF CYCLOHEXANE

FIELD OF THE INVENTION

The invention herein relates to developers for color proofing films, particularly those used in the lithographic printing industry.

BACKGROUND OF THE INVENTION

As is well known, lithographic color printing is usually performed as a four color separation process. The particular scene or copy to be printed is photographed four separate times, once for black and then once each through filters which will pass only light of one of the three process colors (magenta, cyan, and yellow). Each of the negatives is separately developed and used to create separate printing plates. The four printing plates so created are then used sequentially with the appropriate color process inks to create a properly colored printed image by successive overlays of the transparent inks.

Once the four color separation negatives have been made by photographing the scene or copy, but before they are used to create the printing plates, it is normal practice to create proofs from which the printer, artist, stripper or others involved in the printing process can judge the accuracy of the color renditions. Normally this is done by using each negative to create a corresponding colored transparency. The four transparencies thus created are then overlaid and viewed against a lighted background. The artist, printer, stripper or other viewer can thus see what the finished printed subject will look like. If the proof shows that the color renditions are not what was desired, appropriate adjustments can be made on the negatives or the scene can be rephotographed to correct the colors. Any one or more of the four color separation negatives can be redone in this manner to alter the color balance. These proofing steps can, of course, be repeated until the color rendition is judged to be satisfactory. The separation negatives at that point are then used for producing the printing plates from which the final color print is made.

It is also common in lithographic printing to have layouts which require blank spaces in the printing. Commonly this occurs when the layout calls for a slogan, word, logo or the like to be printed against a colorless background. In the proofing stage this requires the use of a film with an opaque coating such that when the film is overlaid with the four color film transparencies no light passes through the opaque portions and the areas that will be clear of color in the final proof can be observed. Development of the opaque coating films has generally been much more difficult in the past than development of the color separation films; proper development of the opaque coatings has required more "aggressive" developers.

Two problems have been common to prior art developers. First, the developers have had problems of odor, toxicity and flammability, making them difficult to store, handle, use and dispose of. This problem has become particularly serious in recent years as more restrictive environmental and occupational health regulations have come into effect. Second, many prior art developers are not sufficiently selective to cleanly remove unexposed portions of the photosensitive coatings while leaving adequate amounts of the exposed portions of the coatings. This results in films which have "dirty" backgrounds; i.e. where the background portions of the scene which should be clear still retain slight tints of color because the photosensitive color coating was not fully removed. Efforts with prior art developers to produce clean backgrounds result in overly aggressive attack of the exposed portions of the coating, reducing the depth of color or otherwise distorting the color in the areas where the color is to be retained in either the solid or screen areas of the film.

It would therefore be advantageous to have a developer which would be sufficiently aggressive to clean background areas thoroughly and develop opaque coatings while yet being sufficiently selective to produce proper development of color portions of the scenes or copy. In addition, such a developer should be nonflammable, nontoxic and not pose significant odor problems.

BRIEF SUMMARY OF THE INVENTION

The developer compositions of this invention are useful for development of photosensitive coatings, whether process (separation) color or opaques, and which are nonflammable, nontoxic and of low odor. In its broadest form a composition of this invention comprises, in weight percent;

| | |
|---|---|
| a glycol acetate | 5–25%; |
| a cyclic alkyl glycol | 10–30%; |
| a surfactant | 0.2–8.0%; |
| as a cosolvent, | |
| a glycol | 3–10%; or |
| an alcohol | 5–15%, or |
| an ester | 5–20%; and |
| water | balance. |

DETAILED DESCRIPTION OF THE INVENTION

The compositions of this invention contain five principal components: a glycol acetate, a cyclic alkyl glycol, a surfactant, a cosolvent and water. It is the critical combination of the nonaqueous components, each in limited quantities, in the aqueous carrier which provides the good development properties in combination with the elimination of toxicity, odor and flammability problems. The invention thus represents a significant improvement over prior art developers, such as those predominantly based on n-propanol and described in U.S. Pat. Nos. 3,136,637 and 3,672,236.

The first component of the present composition is a glycol acetate. Preferably this will be an alkyl glycol monoacetate or diacetate. Particularly useful materials include ethylene glycol monoacetate and ethylene glycol diacetate. The glycol acetate will be present in the composition as from 5–25%, preferably 18–25%. (All percentages stated herein are by weight unless otherwise specified.)

The second principal component of the present composition will be a cyclic alkyl glycol, preferably a glycol derivative of cyclohexane, including the lower alkyl glycol derivatives. A typical compound useful as this component is 1,4-(dihydroxymethyl)cyclohexane, also known as 1,4-cyclohexane dimethanol. The cyclic alkyl glycol component will be present as 10–30%, preferably 15–25%, of the composition.

Also present in the composition will be a surfactant. The surfactant may be cationic, but preferably will be anionic or nonionic, most preferably nonionic. There are a large number of readily available commercial surfactants which are suitable in this invention. Many such commercial materials have proprietary compositions but the general classes and types of surfactants are well known. The following examples of typical useful surfactants will facilitate identification of other surfactants useful in this invention by those skilled in the art: octyl phenoxy polyethoxy ethanol ("Triton X-100"), sodium isodecyl sulfate ("Sipex CAV"), sodium alkylhydroxy sulfate ("Witcolate 7031") and fluorinated alkyl quaternary ammonium iodides ("Fluorad FC-135"). The surfactant will be present as from 0.2–8.0%, preferably 0.2–3.0% of the composition.

Another principal component of the composition, and a significant departure from the developers of the prior art, is a small amount of a cosolvent. In past compositions solvents of this type (notably n-propanol) have constituted the major portion of the developers. It has been considered that to be a suitable developer a composition must contain a major portion of n-propanol or an equivalent solvent to be properly functional. The problems with volatility, toxicity, disposal and the other environmental and occupational health problems were recognized for such developers, but it was considered that such undesirable properties were unavoidable if satisfactory development properties were to be obtained. In the present invention these problems are all avoided and a significant reduction in the amount of solvent present achieved while yet retaining development properties as good as or superior to the prior art developers.

The cosolvent of the present invention will be from any one of three groups of chemicals: glycols, alcohols or esters. Depending on which of the three classes of cosolvents is used, the concentration in the present composition will vary slightly. Glycols will be present as 3–10%, preferably 3–7% of the composition; alcohols will be present as 5–15% and esters will be present as 5–20% of the composition. The suitable glycols will be the lower alkyl glycols, particularly the $C_2$–$C_4$ glycols. Typical examples include ethylene glycol, propylene glycol, dipropylene glycol, diethylene glycol and dimethylene glycol. Suitable alcohols are methanol, n-propanol, isopropanol, ethanol and benzyl alcohol. Suitable esters include dibasic $C_1$–$C_6$ esters and $C_4$–$C_7$ aceto esters with molecular weights in the range of 80–160, exemplified by dimethyl malonate, dimethyl succinate, methyl acetoacetate and ethyl acetoacetate.

Finally, the balance of the composition will be composed of water, which will normally be deionized water. The composition may be manufactured with the water present so that the product is of the proper concentration, or it may be manufactured in a concentrated form with some or all of the water absent, with the appropriate amount of water added prior to use.

The pH of the composition may be varied within the range of about 4–9, although the preferred pH will be in the range of 7–8. Such variations in pH do not affect the performance of the developers.

Compositions of the present invention were used in experimental runs to develop films having both process color coatings and opaque coatings. In order to establish standardized procedures for the exposure and development of the samples, the following conditions were prescribed. A four-color separation negative, which included, along with the pictorial subject matter, continuous-tone "grey scales," halftone dot patterns of known screen values (1–99% 150 lines) and microfine patterns (4μ–80μ), was used to expose the four process color sheets (black, magenta, cyan and yellow) with a high intensity light source in a vacuum frame ("NuArc FlipTop" unit with a 5 KW mercury halide light) for approximately 20 seconds in order to obtain a step 5-6 exposure. Exposure was done in the recommended "E-to-B" configuration, i.e., with the emulsion of the negative touching the base of the color proofing film for an "out of contact" exposure. Development was done by hand in a developing sink at room temperature (75° F.±5° F.; 25° C.±3° C.) using block and pad. The samples used were commercial color proofing films available from Minnesota Mining and Manufacturing Co. under the trade name "Color-Key." Development time was approximately 35–45 seconds for the "K", "M" and "C" "Color-Key" films and 50–60 seconds for the "Y" "Color-Key" film. A satisfactory end product was defined as an acceptable color proof with a screen range of 3–4% highlights and 96–97% shadows, a clean background and uniform color solids.

EXAMPLE 1

For reference purposes, the commercial "Color-Key" developer was used to develop the "Color-Key" films under the conditions described above. While the development gave satisfactory proofs, a strong and pervasive odor was present during the development.

This was in marked comparison to the following sample developer of this invention:

| | |
|---|---|
| ethylene glycol diacetate | 20% |
| 1,4-(dihydroxymethyl) cyclohexane | 20% |
| propylene glycol | 5% |
| "Triton X-100" nonionic surfactant | 1.5% |
| water | 53.5% |

This developer gave results comparable to the control developer ("Color-Key") but without any offensive odor.

EXAMPLE 2

Under conditions similar to those set forth above, an opaque white film (also a commercial "Color-Key film) was processed. The exposure procedure was modified (as recommended by the manufacturer) to a "B-to-B" configuration, i.e., the base of the negative was in contact with the base of the color proofing film. The exposure was only for 5 seconds, yielding the recommended step 3–4 development. Development time was 60–70 seconds. With the commercial developer ("Color-Key") the product had a white image when viewed from the emulsion side. However, it was found that the commercial developer left a haze in the background areas which were supposed to be clean, thereby diminishing the color purity of any additional areas to be viewed through these areas. This result was found in repeated runs with the commercial developer, and is typical of products currently in use in the trade.

The formulation of Example 1 was used under these conditions to develop the same opaque white film. Very good results were obtained, and a number of improvements over the commercial developer were noted:

a. Development was easier and slightly faster than with the commerical material. Development times were in the range of 55–65 seconds.

b. The opaque white image areas retained a higher image density and therefore were whiter. This is believed to be because the developer of this invention attacked the unexposed areas less than did the commercial developer.
c. The fine line and highlight areas were stronger and more uniform. This is also believed to be a result of less attack on the image areas with the present developer.
d. The clear background areas were quite clear, with no haze evident, so that contrast was better and truer color was rendered when the film was incorporated as a layer in a multi-layer proof.

EXAMPLE 3

The developer of this invention described in Example 1 was used to process other opaque colors in the manner described in Example 2. In all cases the present developer produced films which were equal to those produced with the opaque white films.

EXAMPLE 4

The formulation of Example 1 was modified by the addition of pH modifiers to raise the pH from 4.5 to 8.5. Included among such materials were sodium phosphate, tetrapotassium phosphate, diethanolamine and triethanolamine. No appreciable reduction in performance was observed in any of the samples.

EXAMPLES 5-6

The following formulations were prepared:

| Example: | 5 | 6 |
|---|---|---|
| ethylene glycol diacetate | 20% | 20% |
| 1,4-(dihydroxymethyl) cyclohexane | 20% | 20% |
| dipropylene glycol | 5% | — |
| tripropylene glycol | — | 5% |
| nonionic surfactant | 1.5% | 1.5% |
| water | 53.5% | 53.5% |

These developers were compared with the commercial products in the manner described in Example 1. Performance was satisfactory in all regards.

EXAMPLES 7-9

The following formulations were prepared:

| Example: | 7 | 8 | 9 |
|---|---|---|---|
| ethylene glycol diacetate | 20% | 15% | 10% |
| 1,4-(dihydroxymethyl) cyclohexane | 20% | 20% | 20% |
| n-propanol | 5% | 10% | 15% |
| nonionic surfactant | 1.5% | 1.5% | 1.5% |
| water | 53.5% | 53.5% | 53.5% |

These developers were compared with the commercial products in the manner described in Example 1. Performance was satisfactory in all regards.

EXAMPLES 10-15

| Example: | 10 | 11 | 12 | 13 | 14 | 15 |
|---|---|---|---|---|---|---|
| ethylene glycol diacetate | 15% | 20% | 15% | 15% | 10% | 20% |
| 1,4-(dihydroxymethyl) cyclohexane | 20% | 20% | 20% | 20% | 20% | 20% |
| methanol | 10% | — | — | — | — | — |
| ethanol | — | 5% | 10% | — | — | — |
| isopropanol | — | — | — | 10% | 20% | — |
| butanol | — | — | — | — | — | 5% |
| nonionic surfactant | 1.5% | 1.5% | 1.5% | 1.5% | 1.5% | 1.5% |
| water | 53.5% | 53.5% | 53.5% | 53.5% | 48.5% | 53.5% |

These developers were compared with the commercial products in the manner described in Example 1. Performance was satisfactory in all regards.

EXAMPLES 16-21

The following compositions were prepared:

| | |
|---|---|
| ethylene glycol diacetate | 15% |
| 1,4-(dihydroxymethyl) cyclohexane | 20% |
| dibasic ester | 5% |
| nonionic surfactant | 1.5% |
| water | 58.5% |

In each example the dibasic ester was as follows:

| Example | Ester |
|---|---|
| 16 | dimethyl malonate |
| 17 | methyl acetoacetate |
| 18 | ethyl acetoacetate |
| 19 | ethyl ethoxypropionate |
| 20 | dimethyl succinate |
| 21 | diethyl fumarate |

These developers were compared with the commercial products in the manner described in Example 1. Performance was satisfactory in all regards.

EXAMPLES 22-30

The developers described in Table 1 below were prepared. These developers were compared with the commercial products in the manner described in Example 1. Performance was satisfactory in all regards.

TABLE 1

| Example: | 22 | 23 | 24 | 25 | 26 | 27 | 28 | 29 | 30 |
|---|---|---|---|---|---|---|---|---|---|
| ethylene glycol diacetate | 5% | 5% | 10% | 20% | 15% | 10% | 5% | 25% | 5% |
| ethylene glycol monoacetate | — | — | — | — | 20% | — | — | — | — |
| 1,4-(dihydroxymethyl) cyclohexane | 20% | 25% | 30% | 20% | 10% | 10% | 20% | 25% | 20% |
| methyl acetoactate | 5% | — | — | — | — | — | 20% | — | — |
| dimethyl malonate | — | 10% | — | 5% | — | — | — | 5% | — |
| ethyl acetoacetate | — | — | — | — | — | — | — | — | 20% |

TABLE 1-continued

| Example: | 22 | 23 | 24 | 25 | 26 | 27 | 28 | 29 | 30 |
|---|---|---|---|---|---|---|---|---|---|
| isopropanol | 15% | — | — | 5% | — | — | — | — | — |
| n-propanol | — | 10% | 8% | — | — | 13% | — | — | — |
| benzyl alcohol | — | — | 2% | — | — | 2% | — | — | — |
| ethylene glycol | — | — | — | — | 5% | — | — | — | — |
| nonionic surfactant | 1.5% | 1.5% | 1.5% | 1.5% | 1.5% | 1.5% | 1.5% | 1.5% | 1.5% |
| water | 53.5% | 48.5% | 48.5% | 48.5% | 48.5% | 63.5% | 53.5% | 43.5% | 53.5% |

EXAMPLE 31

Formulations as in Example 1 were prepared with variations in the surfactant concentration and in the type of surfactant. Concentration varied within the range of 0.1% to 3%; all showed comparable satisfactory performance. Among the surfactants observed were nonionic, cationic and anionic surfactants, including the alkoxylated alkyl phenols and alkyl or alkylaryl sulfates, as well as amine perfluoroalkyl sulfonates and fluoroalkyl quaternary ammonium iodides.

With all of the example compositions shown above, no problems of toxicity, dermatological attack, volatility or flammability were encountered. Odors of the samples were mild to nondetectable; for those samples where an odor was detectable the odor was not unpleasant. In addition, all compositions were such that they could be disposed of into municipal sewer systems for conventional sewage treatment; the special handling and disposal which must be used with the current commercial developers were not required.

It will be evident that there are many embodiments of this invention which are not described above, but which are clearly within the scope and spirit of the invention. Consequently, the above description is to be considered to be exemplary only and the scope of the invention is to be limited solely by the appended claims.

We claim:

1. A developer composition for lithographic color proofing film which consists essentially of, in weight percent:

| | |
|---|---|
| a glycol acetate | 5-25%; |
| an alkyl glycol derivative of cyclohexane | 10-30%; |
| a surfactant as a cosolvent, | 0.2-8.0%; |
| a glycol | 3-10%, or |
| an alcohol | 5-15%, or |
| an ester | 5-20%, and |
| water | balance. |

2. A developer composition as in claim 1 wherein said glycol acetate is an alkyl glycol mono- or diacetate.

3. A developer composition as in claim 1 wherein said cyclic alkyl glycol is an lower alkyl glycol derivative of cyclohexane.

4. A developer composition as in claim 1 wherein said cosolvent is a glycol.

5. A developer composition as in claim 4 wherein said glycol is a lower alkyl glycol.

6. A developer composition as in claim 5 wherein said glycol is a $C_2$-$C_4$ alkyl glycol.

7. A developer composition as in claim 1 wherein said cosolvent is an alcohol.

8. A developer composition as in claim 7 wherein said alcohol is a $C_1$-$C_3$ alkyl alcohol or benzyl alcohol.

9. A developer composition as in claim 1 wherein said cosolvent is an ester.

10. A developer composition as in claim 9 wherein said ester is a dibasic $C_1$-$C_6$ ester or $C_4$-$C_7$ aceto ester of 80-160 molecular weight.

11. A developer composition as in claim 10 wherein said ester is dimethyl malonate, dimethyl succinate, methyl acetoacetate or ethyl acetoacetate.

12. A developer composition as in claim 1 wherein said surfactant is an anionic or nonionic surfactant.

13. A developer composition as in claim 12 wherein said surfactant is a nonionic surfactant.

14. A developer composition for lithographic color proofing film which consists essentially of, in weight percent:

| | |
|---|---|
| a glycol acetate | 18-25%; |
| [a cyclic] an alkyl glycol derivative of cyclohexane | 15-25%; |
| a nonionic surfactant as a cosolvent, | 0.2-3.0%; |
| a glycol | 3-7%, or |
| an alcohol | 5-15%, or |
| an ester | 5-20%; and |
| water | balance. |

* * * * *